(12) United States Patent
Kovac et al.

(10) Patent No.: US 9,425,762 B2
(45) Date of Patent: Aug. 23, 2016

(54) SYSTEM AND METHOD FOR TUNING AN RF CIRCUIT

(71) Applicant: Peregrine Semiconductor Corporation, San Diego, CA (US)

(72) Inventors: David Kovac, Arlington Heights, IL (US); Dan William Nobbe, Crystal Lake, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 13/969,294

(22) Filed: Aug. 16, 2013

(65) Prior Publication Data

US 2015/0048896 A1 Feb. 19, 2015

(51) Int. Cl.
| | | |
|---|---|---|
| H03K 5/00 | (2006.01) | |
| H03H 7/12 | (2006.01) | |
| H03H 11/04 | (2006.01) | |
| H03H 19/00 | (2006.01) | |
| H03J 5/24 | (2006.01) | |

(52) U.S. Cl.
CPC .............. *H03H 7/12* (2013.01); *H03H 11/0422* (2013.01); *H03H 19/004* (2013.01); *H03J 5/244* (2013.01); *H03H 2210/025* (2013.01); *H03H 2210/026* (2013.01); *H03H 2210/04* (2013.01); *H03H 2210/046* (2013.01); *H03J 2200/10* (2013.01)

(58) Field of Classification Search
USPC ............. 333/47, 2, 17, 46, 344; 327/551–559
See application file for complete search history.

(56) References Cited

U.S. PATENT DOCUMENTS

| | | | | |
|---|---|---|---|---|
| 5,408,863 | A | * | 4/1995 | Sawyers et al. ............... 73/35.05 |
| 5,982,228 | A | * | 11/1999 | Khorramabadi et al. ..... 327/553 |
| 6,262,624 | B1 | * | 7/2001 | Tsinker .......................... 327/553 |
| 6,307,442 | B1 | * | 10/2001 | Meyer ...................... H03H 7/06 333/17.1 |
| 6,408,010 | B1 | * | 6/2002 | Stroet ................... H03F 3/4508 327/552 |
| 7,075,363 | B1 | * | 7/2006 | Thon ...................... H03H 15/02 327/270 |
| 7,714,643 | B1 | * | 5/2010 | Wang et al. ................... 327/553 |
| 8,436,693 | B2 | * | 5/2013 | Fahs et al. ..................... 333/17.1 |
| 2002/0110211 | A1 | * | 8/2002 | Bockelman ................... 375/371 |
| 2013/0222075 | A1 | | 8/2013 | Reedy et al. |
| 2014/0266460 | A1 | | 9/2014 | Nobbe et al. |

FOREIGN PATENT DOCUMENTS

WO 2009108391 9/2009

* cited by examiner

*Primary Examiner* — Dinh T Le
(74) *Attorney, Agent, or Firm* — Jaquez Land Greenhaus LLP; Martin J. Jaquez, Esq.; Alessandro Steinfl, Esq.

(57) ABSTRACT

A tuning system connected to a tunable RF circuit is described. The tuning system obtains an output of a sensing circuit and processes the output in the control circuit in order to tune one or more passive components in the tunable RF circuit. A related method is also described.

25 Claims, 5 Drawing Sheets

SPTM Architecture

SYSTEM AND METHOD FOR TUNING AN RF CIRCUIT

BACKGROUND

1. Field

The present application relates to RF circuits. In particular, it relates to a system and a method for tuning an RF circuit comprising capacitor and/or inductor elements.

2. Description of Related Art

Passive components, such as resistors, inductors and capacitors, when implemented on a chip, can have absolute tolerances of +/−20% and worse. A resulting center frequency of a baseband filter comprising such passive components can likewise vary by an amount in correspondence of a mathematical relation between the center frequency and values of the passive components, which could potentially exceed an allowable bandwidth.

SUMMARY

According to a first aspect a system is provided, the system comprising a sensor circuit configured to provide a first signal used to tune one or more adjustable passive elements; the sensor circuit comprising one or more adjustable passive elements; a tunable RF circuit configured to receive a second signal; the tunable RF circuit comprising one or more adjustable passive elements; and a control circuit operatively connected to the sensor circuit and the tunable RF circuit whereby the control circuit receives the first signal from the sensor circuit and provides a second signal to the tunable RF circuit used to configure the one or more adjustable passive elements of the tunable RF circuit.

According to a second aspect a method of tuning an RF circuit is provided, the method comprising: providing a sensor circuit comprising one or more adjustable passive elements that determine a characteristic corresponding to a first signal; providing a tunable RF circuit comprising one or more adjustable passive elements, wherein each adjustable passive element of the tunable RF circuit corresponds to passive elements of the sensor circuit; and providing a control circuit configured to track and adjust the tunable RF circuit based on the first signal.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Figure 1:
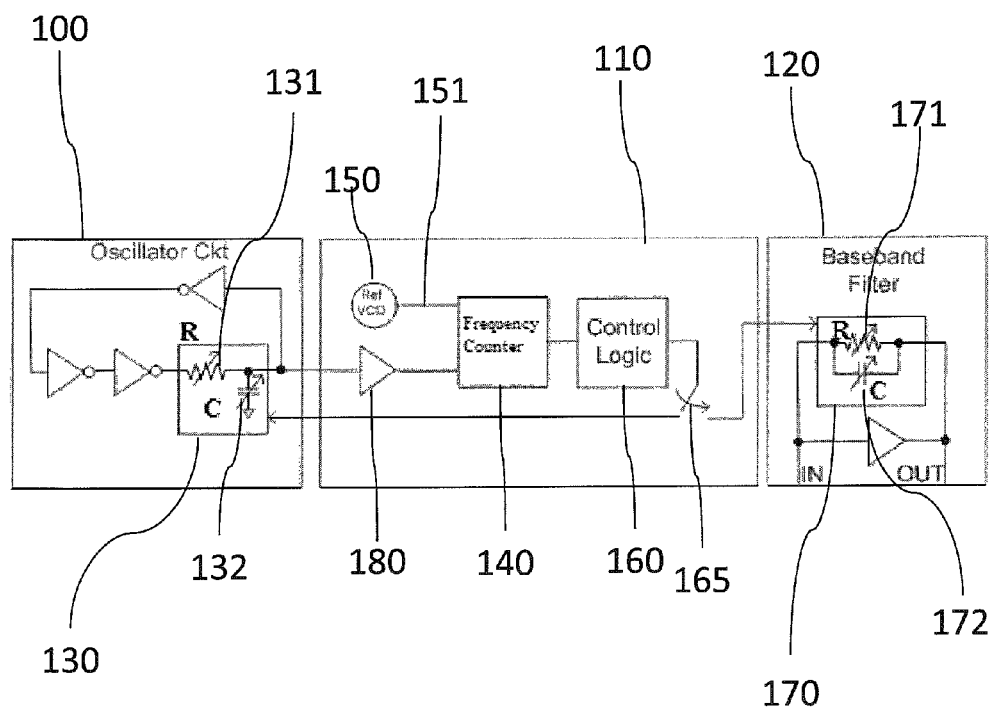
FIG. 1 shows a block diagram of an RC tracking oscillator system used to track and adjust the frequency response of a baseband filter.

An RC tracking oscillator system can be used to adjust RC components in any type of analog control systems where an RC tolerance needs to be precise. FIG. 1 shows a block diagram implementation of an RC tracking oscillator system used to adjust the frequency response of a tunable RF circuit. An example of such tunable RF circuit can be a baseband filter. The RC tracking oscillator system includes an oscillator circuit (100) and a frequency comparison and tuning circuit (110). Circuit (110) is connected to a baseband filter (120), the frequency of which has to be adjusted. The baseband filter, for example, can be implemented as an operational amplifier having a signal input (IN) and a signal output (OUT) with a given RC feedback. The aim of the system is to tune the value of an adjustable resistor (171) and an adjustable capacitor (172) in the baseband filter (120).

In the block diagram implementation shown in FIG. 1, the oscillator circuit (100) is a ring oscillator that uses an adjustable set of passive elements (130) comprising an adjustable resistor (131) and an adjustable capacitor (132). The adjustable set of passive elements (130) is a replica of an adjustable set of passive elements (170), present in the baseband filter (120), which comprises an adjustable resistor (171) and an adjustable capacitor (172).

The adjustable capacitor (132) can comprise an array of parallel capacitors which can be switched on or off individually. To provide the adjustable value for the adjustable capacitor, one or more of the capacitors can be switched on. Similarly, the adjustable resistor (131) can be constructed and operate the same way as the adjustable capacitor to provide the adjustable values for the adjustable resistor.

The adjustable set of passive elements (130) in the oscillator circuit (100) is used to set an oscillation frequency of the oscillator circuit (100). An output of the oscillator circuit (100) is fed into the frequency comparison and tuning circuit (110). The frequency comparison and tuning circuit (110) comprises a buffer (180), a frequency counter (140), a reference voltage controlled oscillator (VCO) (150) which outputs a reference VCO signal (151), and a control logic circuit (160). The reference VCO (150) can be a crystal oscillator. By way of example, a Colpitts oscillator with a crystal tank element can be used as the crystal oscillator to make a reference VCO signal precise and insensitive to temperature changes. Furthermore, the reference VCO (150) can be enabled when tuning of the oscillator circuit (100) occurs, otherwise the reference VCO can be turned off. The reference VCO signal (151) outputted from the reference VCO (150) has a frequency, which is usually greater than an expected frequency out of the oscillator circuit (100).

Upon being fed into the frequency comparison and tuning circuit (110), the output of the oscillator circuit (100) is buffered by the buffer (180) to produce a buffered output of the oscillator circuit (100). In particular, the buffer (180) provides isolation between the oscillator circuit (100) and the frequency counter (140) to prevent the operation of the frequency counter (140) from affecting the output coming from the oscillator circuit (100). The buffer (180) also can ensure that the signal amplitude from the oscillator circuit (100) is high enough to properly drive the frequency counter (140).

The frequency counter (140) compares the buffered output of the oscillator circuit (100) to the reference VCO signal (151). The reference VCO signal (151) stays at a fixed frequency while the oscillator circuit (100) is tuned by adjusting the value of the adjustable resistor (131) and/or adjustable capacitor (132). In particular, the control logic circuit (160) adjusts the adjustable resistor (131) and the adjustable capacitor (132) of the oscillator circuit (100) until a frequency difference (or error) between a frequency of the reference VCO signal (151) and a frequency of the buffered output of the oscillator circuit (100) is minimized.

Once the adjustable resistor (131) and adjustable capacitor (132) of the oscillator circuit (100) are set to values (represented by R and C, respectively) that minimize the frequency difference (or error) between a frequency of the reference VCO signal (151) and the frequency of the output of the oscillator circuit (100), a switch (165) is triggered to allow the control logic circuit (160) to set the adjustable resistor (171) and the adjustable capacitor (172) of the baseband filter (120) to the same values (R and C) as the adjustable resistor (131) and the adjustable capacitor (132) within the oscillator circuit (100).

As shown in FIG. 1, the switch (165) has two possible positions. In a first position of the switch (165), the switch (165) forms a loop comprising the oscillator circuit (100) and the frequency comparison and tuning circuit (110). In such position, the adjustable resistor (131) and the adjustable capacitor (132) are tuned according to the reference VCO signal (151).

Once the control logic circuit (160) obtains tuned resistor and capacitor values for the oscillator circuit (100) that have a minimized frequency difference in comparison to the reference VCO signal (151), the switch (165) can then transition into a second position. In the second position of the switch (165), the control logic circuit (160) is now able to transfer the tuned values obtained for the adjustable resistor (131) and the adjustable capacitor (132) of the oscillator circuit (100) to the adjustable resistor (171) and the adjustable capacitor (172) of the baseband filter (120).

By minimizing an error between the frequency of the reference VCO (150) and the oscillator circuit (100), an error between an actual base corner frequency of the baseband filter (120) and a desired corner frequency for the baseband filter is also minimized. It should be noted that both the corner frequency of the baseband filter (120) and the oscillation frequency of the oscillator circuit (100) are proportional to 1/RC.

Figure 2A:
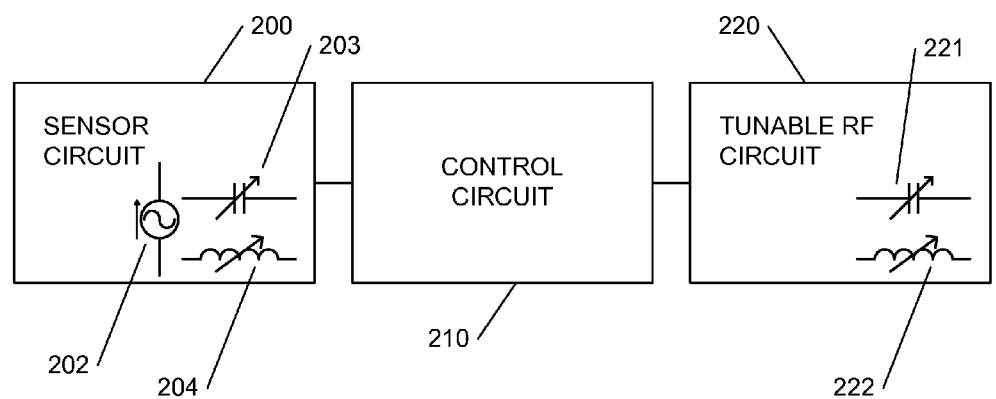
FIG. 2A shows a block diagram of an embodiment whereby a sensor circuit is used in conjunction with a control circuit to track and adjust a frequency response for a tunable RF circuit.

FIG. 2A shows a block diagram of an embodiment used to track and adjust the frequency response of a tunable RF circuit (220). The tunable RF circuit can comprise capacitor 221 and/or inductor 222 elements. Furthermore, with respect to the embodiment shown in FIG. 2A, tracking and adjusting the frequency response of the tunable RF circuit (220) is performed through a sensor circuit (200) and a control circuit (210). The RF circuit (220) can be configured to provide any class of filter, such as a band-pass filter, a low-pass filter or a high-pass filter. According to further embodiments of the present disclosure, configuration of the RF circuit (220) can be performed via variable/tunable elements, such as variable/tunable capacitors 221 and/or variable/tunable inductors 222, comprised in the circuit. Examples of such variable/tunable elements are digitally tunable capacitors (DTCs) and/or digitally tunable inductors (DTLs), as described, for example, in PCT publication number WO2009/108391 entitled "Method and Apparatus for use in Digitally Tuning a Capacitor in an Integrated Circuit Device", published on Sep. 3, 2009, and in U.S. patent application No. 13/595,893 entitled "Methods and Apparatuses for Use in Tuning Reactance in an Integrated Circuit Device", filed on Aug. 27, 2012, both incorporated by reference herein in their entirety, where examples of digital tuning capacitors and/or digital tuning inductors for use in a tunable network are disclosed. In the exemplary case where a DTC and/or DTL is used to tune (e.g., configure) the RF circuit (220), such tuning is a stepwise tuning, whereby corresponding tunable element values are varied stepwise.

The sensor circuit (200) is configured to provide an output to the control circuit (210) used to track and adjust the tunable RF circuit (220). According to some embodiments of the present disclosure, the sensor circuit (200) comprises a current source 202 with variable/tunable capacitor 203 and/or variable/tunable inductor 204 elements, such as for example a DTC and/or a DTL, used to help track and adjust similar capacitor 221 and/or inductor 222 elements in the tunable RF circuit (220). For example, the current source 202 could be used in conjunction with a variable/tunable capacitor 203 within the sensor circuit (200) to provide a capacitance value by which a variable/tunable capacitor 221 element within the tunable RF circuit (220) would be tracked and adjusted with respect to the former. Similar embodiments are possible whereby a variable/tunable inductor 204 element or even both a variable/tunable capacitor 203 and a variable/tunable inductor 204 element are acted on in a similar fashion with the current source 202 to provide a reference output by which the tunable RF circuit (220) tracks and adjusts its respective elements (capacitors 221 and/or inductors 222) accordingly under control of the control circuit (210).

With reference to the control circuit (210), the control circuit (210) is configured to track a signal (e.g. by using tunable elements of the sensor circuit 200, such as DTCs and DTLs) in correspondence of a desired frequency response from the sensor circuit (200) and adjust the inductor element and/or capacitor elements of the tunable RF circuit (220) accordingly. In an embodiment of the present disclosure, the control circuit (210) can comprise a buffer, an RF divider, a frequency counter, an analog-to-digital (A/D) converter, and a reference VCO which outputs a reference VCO signal.

Figure 2B:
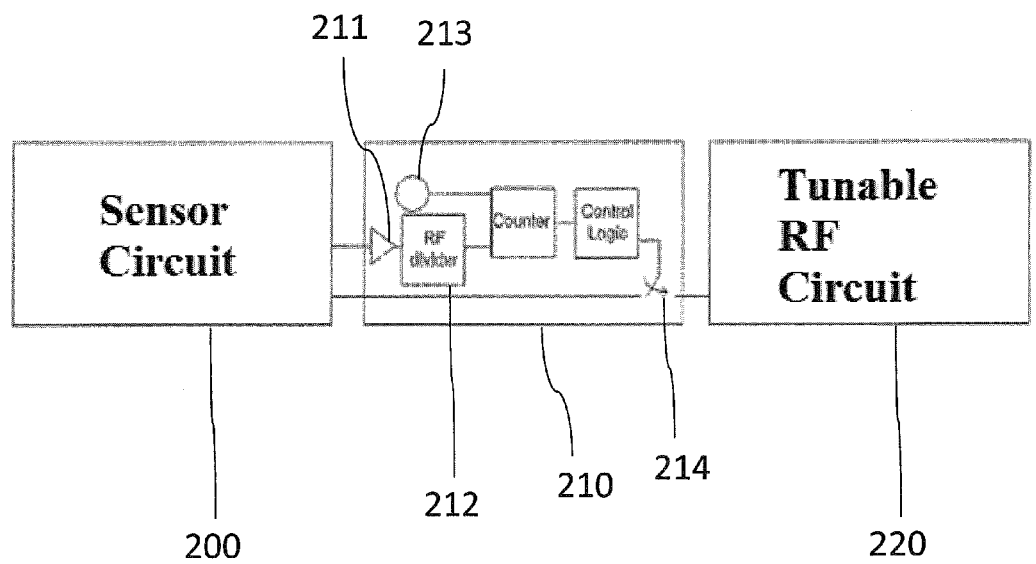
FIG. 2B shows an embodiment of the control circuit.

With reference to FIG. 2B, the present disclosure provides an example embodiment of the control circuit (210). With respect to the control circuit (210), an output from the sensor circuit (200) is first provided to the control circuit (210). The output from the sensor circuit (200) can be an output with a high frequency which may need to be buffered. The buffer (211) may be used within the control circuit (210) because in some embodiments, the output of the sensor circuit (200) can be sensitive with respect to a load when operating with RF signals. Additionally, the buffer (211) can also ensure that the signal amplitude coming from sensor circuit (200) is high enough to properly drive the control circuit (210) (e.g. the frequency counter if used).

Through the use of the buffer (211), the control circuit (210) ensures that the output from the sensor circuit (200) is not affected by other potential processes performed within the control circuit (210). Additionally, the output from the sensor circuit (200) can also be divided down using an RF divider (212). By using both the buffer (211) and the RF divider (212), an embodiment can adapt the signal coming from the sensor circuit (200) with a frequency low enough so that the output signal can be utilized within the control circuit (210). For example, if the embodiment uses a reference signal generator (213) (internal to the control circuit (210)), the control circuit (210) may now be able to compare the output signal from the sensor circuit (200) with the output from the reference signal generator (213) within the control circuit (210).

Figure 2C:
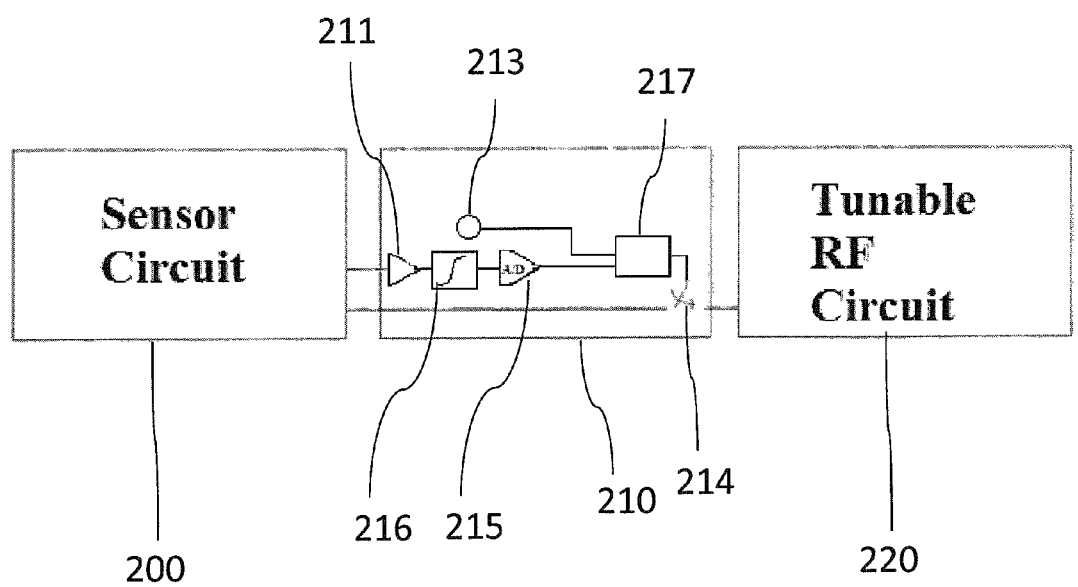
FIG. 2C shows a digital implementation of an embodiment of the control circuit.

By way of example and not of limitation, the control circuit (210) can use a reference signal generator (213), for example, a reference VCO that is a crystal oscillator. The reference signal generator (213) can be used to calibrate a filter (e.g. pass-band) of the tunable RF circuit (220). In an embodiment of the present disclosure, the control circuit (210) can use a divided down output signal from the sensor circuit (200) and compare that signal to a signal generated from a reference signal generator within the control circuit (210), for example, via a frequency counter. Furthermore, in an embodiment of the present disclosure, a comparator can be used to measure a difference between the reference signal from the reference signal generator to compare that signal from the signal generated from the sensor circuit (200). In other embodiments, a counter or an analog-to-digital converter (215) can be used, for example, as seen in FIG. 2C.

With reference back to FIG. 2B, once values of the sensor circuit (200) (e.g. corresponding tunable elements, such as DTC and/or DTL) are obtained that minimize an error (e.g. frequency difference) between a signal (e.g. frequency) from the reference signal generator within the control circuit (210) and the signal (e.g. frequency) coming from the sensor circuit (200), a transfer signal within the control signal (210) can be triggered so that the control circuit (210) is able to transfer values corresponding to the sensor circuit (200) to the tunable RF circuit (220). In alternative embodiments, a switch (214) could be used in conjunction with the transfer signal to transfer the values corresponding to the sensor circuit (200) to the tunable RF circuit (220). In particular, the adjustable inductor and/or the adjustable capacitor of the tunable RF circuit (220) can now be tuned (e.g. the adjustable inductors and capacitors being tuned together as a group or individually as separate elements) according to the values obtained from the sensor circuit (200). Furthermore, there may be embodiments where the tunable RF circuit (220) comprises only adjustable inductors or only adjustable capacitors. Therefore, such embodiments would be able configured to adjust one or more inductors or one or more capacitors as desired. As a further example, since both an oscillation frequency of the sensor circuit (200) and the pass-band of the tunable RF circuit (220) are proportional to $1/\sqrt{LC}$, a center frequency of the tunable RF circuit (220) can be accurately adjusted based on the relationship.

In an embodiment of FIG. 2B where a switch (214) may be implemented to transfer values from the sensing circuit (200) to the tunable RF circuit (220), such switch (214) may have two possible positions. In a first position of the switch (214), the switch forms a loop comprising the sensor circuit (200) and the control circuit (210). In such position, sensor circuit (200) can be tuned according to the control circuit (210) (e.g. according to a reference signal generator found within the control circuit (210)). Once the control circuit (210) obtains a tuned sensor circuit (200) that has a minimized frequency difference in comparison to the reference signal generator within the control circuit (210), the switch (214) can then transition into a second position. In the second position of the switch (214), the control circuit (210) is now able to transfer the tuned values obtained from the sensor circuit (200) to the tunable RF circuit (220).

Thus, the switch (214) in the control circuit (210) can be seen as creating two different modes of operation. A first mode can be viewed as a tuning mode for the sensor circuit (200) whereby the sensor circuit (200) can be adjusted/tuned based on a signal in the control circuit (210) (e.g. reference signal). A second mode can be viewed as a value transfer mode where the tuned values from the sensor circuit (200) are provided to the tunable RF circuit (220).

Alternative to the embodiment seen in FIG. 2B, a combination of an analog/digital embodiment of the control circuit can be provided as shown in FIG. 2C. The main difference between the two embodiments is the implementation of the analog-to-digital converter (215). With respect to the embodiment from FIG. 2C, an output from the sensor circuit (200) can be a voltage being measured from a capacitance associated with the sensor circuit (200). A buffer (211) is used in order to buffer the output signal in order to provide a better current handling for the control circuit (210). The buffered output signal is then provided to an integrator (216) whereby the integrator (216) sums up the sensed voltages from the sensor circuit (200) over a period of time (e.g. time constant). A logic circuit (217) then compares the output of the analog-to-digital converter (215) and a signal from the reference signal generator (213) (e.g. voltage). The reference signal generator (213) can provide a reference voltage to be compared with the output from the sensor circuit (200). A determination as to what the control circuit (210) then does with the signal, for example, with reference to switch (214) is then decided upon according to the relationship between the reference signal generator (213) and the output coming from the analog-to-digital converter (215). Furthermore, another embodiment according to the present disclosure can show the reference voltage from the reference signal generator (213) being compared via a lookup table or in a memory located in the logic circuit (217).

Figure 3:
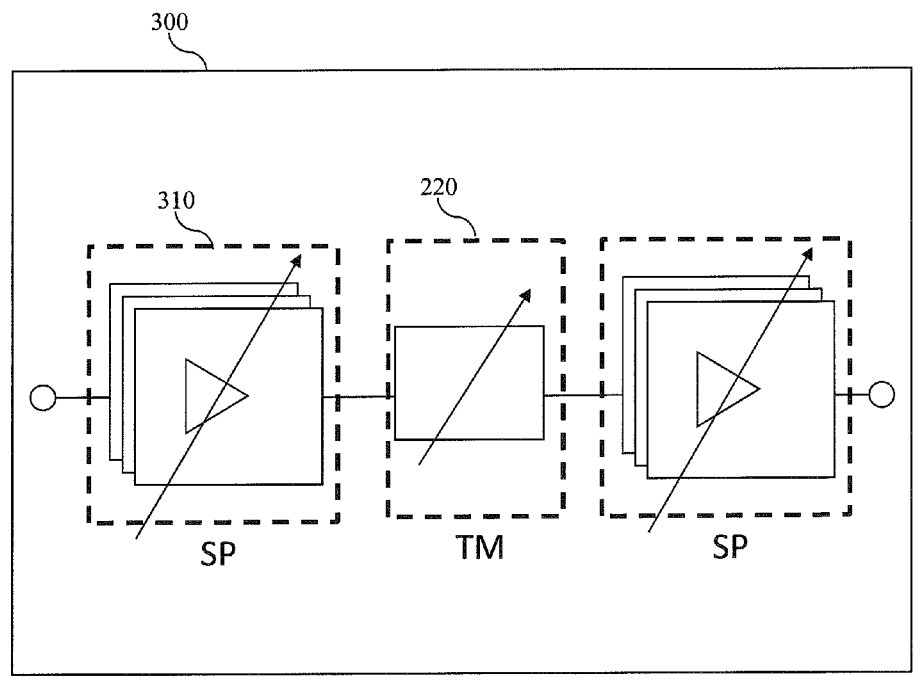
FIG. 3 shows a scalable periphery tunable matching (SPTM) network where the tunable RF circuit is implemented within the tunable matching (TM) network.

The embodiments provided above with reference to the tunable RF circuit (220) can be used in a scalable periphery tunable matching (SPTM) network. As seen in FIG. 3, the tunable RF circuit (220) is part of/integrated within the SPTM network (300). In an embodiment of the present disclosure, the tunable matching (TM) network (300) can be implemented to provide impedance matching for scalable periphery (SP) amplifiers, such as the final stage (310). SPTM networks are shown, for example, U.S. patent application Ser. No. 13/797,779 (titled "Scalable Periphery Tunable Matching Power Amplifier" and filed on Mar. 12, 2013), which is incorporated herein by reference in its entirety.

The examples set forth above are provided to give those of ordinary skill in the art a complete disclosure and description of how to make and use the embodiments of the system and method for tuning an RF circuit of the disclosure, and are not intended to limit the scope of what the inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. A system for tuning component values of a tunable radio frequency (RF) circuit based on similar component values of an active sensor circuit, comprising:
  (a) a tunable RF circuit having at least one adjustable capacitor having a variable capacitance C and at least one adjustable inductor having a variable inductance L coupled and configured to filter an applied input signal, the tunable RF circuit having a passband proportional to $1/\sqrt{LC}$ based on selected values of L and C, wherein the at least one adjustable capacitor and the at least one adjustable inductor are configured to receive a tuning signal and use the tuning signal to select the respective values for L and C;

(b) an active sensor circuit comprising:
   (1) at least one adjustable reference capacitor configured to be similar to the at least one adjustable capacitor of the tunable RF circuit and having a variable capacitance C;
   (2) at least one adjustable reference inductor configured to be similar to the at least one adjustable inductor of the tunable RF circuit and having a variable inductance L; and
   (3) a current source coupled to the at least one adjustable reference capacitor and to the at least one adjustable reference inductor;
   wherein the at least one adjustable reference capacitor and the at least one adjustable reference inductor are configured to receive the tuning signal and use the tuning signal to select respective values for L and C, and wherein the current source, the at least one adjustable reference capacitor, and the at least one adjustable reference inductor are configured so as to provide a high frequency sensor output signal proportional to $1/\sqrt{LC}$ based on the selected respective values of L and C for the at feast one adjustable reference capacitor and the at least one adjustable reference inductor; and (c) a control circuit operatively connected to the active sensor circuit and to the tunable RF circuit, including:
   (1) a buffer circuit for receiving the high frequency sensor output signal from the active sensor circuit and outputting a buffered high frequency sensor output signal;
   (2) an RF divider circuit, coupled to the buffer circuit, for generating a divided-down output signal from the buffered high frequency sensor output signal, the divided-down output signal having a reduced frequency low enough to enable further utilization within the control circuit;
   (3) a reference signal generator for generating a reference signal:
   (4) a frequency counter, coupled to the reference signal generator and to the RF divider circuit, for generating the tuning signal, the tuning signal representing a frequency difference between the reference signal and the divided-down output signal: and (5) a switch for selectably providing the tuning signal to the active sensor circuit until the frequency difference represented by the tuning signal has been minimized by selection of particular respective values of L and C for the at least one adjustable reference capacitor and the at least one adjustable reference inductor, and thereafter providing the tuning signal to the tunable RF circuit to select respective values of L and C for the at least one adjustable capacitor and the at least one adjustable inductor of the tunable RF circuit that essentially match the particular respective values of L and C for the at least one adjustable reference capacitor and the at least one adjustable reference inductor.

2. A system for tuning component values of a tunable radio frequency (RF) circuit based on similar component values of an active sensor circuit, comprising:

(a) a tunable RF circuit having at least one adjustable capacitor having a variable capacitance C and at least one adjustable inductor having a variable inductance L coupled and configured to filter an applied input signal, the tunable RF circuit having a passband proportional to $1/\sqrt{LC}$ based on selected values of L and C, wherein the at least one adjustable capacitor and the at least one adjustable inductor are configured to receive a tuning signal and use the tuning signal to select the respective values for L and C;

(b) an active sensor circuit comprising:
   (1) at least one adjustable reference capacitor configured to be similar to the at least one adjustable capacitor of the tunable RF circuit and having a variable capacitance C;
   (2) at least one adjustable reference inductor configured to be similar to the at least one adjustable inductor of the tunable RF circuit and having a variable inductance L; and
   (3) a current source coupled to the at least one adjustable reference capacitor and to the at least one adjustable reference inductor:
   wherein the at least one adjustable reference capacitor and the at least one adjustable reference inductor are configured to receive the tuning signal and use the tuning signal to select respective values for L and C, and wherein the current source, the at least one adjustable reference capacitor, and the at least one adjustable reference inductor are configured so as to provide a high frequency sensor output signal proportional to $1/\sqrt{LC}$ based on the selected respective values of L and C for the at least one adjustable reference capacitor and the at least one adjustable reference inductor; and (c) a control circuit operatively connected to the active sensor circuit and to the tunable RF circuit, including:
   (1) a buffer circuit for receiving the high frequency sensor output signal from the active sensor circuit and outputting a buffered high frequency sensor output signal;
   (2) an integrator, coupled to the buffer circuit, for summing up the buffered high frequency sensor output signal over a period of time and generating an integrator output signal;
   (3) an analog-to-digital converter, coupled to the integrator, for generating a digital signal from the integrator output signal;
   (4) a reference signal generator for generating a reference signal;
   (5) a logic circuit, coupled to the reference signal generator and to the analog-to-digital converter, for comparing the digital signal and the reference signal to generate the tuning signal, the tuning signal representing a frequency difference between the reference signal and the digital signal; and
   (6) a switch for selectably providing the tuning signal to the active sensor circuit until the frequency difference represented by the tuning signal has been minimized by selection of particular respective values of L and C for the at least one adjustable reference capacitor and the at least one adjustable reference inductor, and thereafter providing the tuning signal to the tunable RF circuit to select respective values of L and C for the at least one adjustable capacitor and the at least one adjustable inductor of the tunable RF circuit that essentially match the particular respective values of L and C for the at least one adjustable reference capacitor and the at least one adjustable reference inductor.

3. The system according to claim 1 or claim 2, wherein the reference signal generator of the control circuit comprises a crystal oscillator.

4. The system according to claim 1 or claim 2, wherein at least one adjustable inductor and at least one adjustable reference inductor is a digitally tunable inductor (DTL).

5. The system according to claim 1 or claim 2, wherein at least one adjustable capacitor and at least one adjustable reference capacitor is a digitally tunable capacitor (DTC).

6. A method for tuning component values of a tunable radio frequency (RF) circuit based on similar component values of an active sensor circuit, comprising:
 (a) providing a tunable RF circuit having at least one adjustable capacitor having a variable capacitance C and at least one adjustable inductor having a variable inductance L coupled and configured to filter an applied input signal, the tunable RF circuit having a passband proportional to $1/\sqrt{LC}$ based on selected values of L and C;
 (b) configuring the at least one adjustable capacitor and the at least one adjustable inductor of the tunable RF circuit to receive a tuning signal and use the tuning signal to select the respective values for L and C;
 (c) providing an active sensor circuit comprising:
  (1) at least one adjustable reference capacitor configured to be similar to the at least one adjustable capacitor of the tunable RF circuit and having a variable capacitance C;
  (2) at least one adjustable reference inductor configured to be similar to the at least one adjustable inductor of the tunable RF circuit and having a variable inductance L; and
  (3) a current source coupled to the at least one adjustable reference capacitor and to the at least one adjustable reference inductor;
 (d) configuring the current source, the at least one adjustable reference capacitor, and the at least one adjustable reference inductor of the active sensor circuit so as to provide a high frequency sensor output signal proportional to $1/\sqrt{LC}$ based on the selected respective values of L and C for the at least one adjustable reference capacitor and the at least one adjustable reference inductor;
 (e) configuring the at least one adjustable reference capacitor and the at least one adjustable reference inductor of the active sensor circuit to receive the tuning signal and use the tuning signal to select respective values for L and C;
 (f) providing a control circuit operatively connected to the active sensor circuit and to the tunable RF circuit, including:
  (1) a buffer circuit for receiving the high frequency sensor output signal from the active sensor circuit and outputting a buffered high frequency sensor output signal;
  (2) an RF divider circuit, coupled to the buffer circuit, for generating a divided-down output signal from the buffered high frequency sensor output signal, the divided-down output signal having a reduced frequency low enough to enable further utilization within the control circuit;
  (3) a reference signal generator for generating a reference signal; and
  (4) a frequency counter, coupled to the reference signal generator and to the RF divider circuit, for generating a tuning signal, the tuning signal representing a frequency difference between the reference signal and the divided-down output signal;
 (g) generating values for the tuning signal until the frequency difference represented by the tuning signal has been minimized by selection of particular respective values of L and C for the at least one adjustable reference capacitor and the at least one adjustable reference inductor, and thereafter providing the tuning signal to the tunable RF circuit to select respective values of L and C for the at least one adjustable capacitor and the at least one adjustable inductor of the tunable RF circuit that essentially match the particular respective values of L and C for the at least one adjustable reference capacitor and the at least one adjustable reference inductor.

7. A method for tuning component values of a tunable radio frequency (RF) circuit based on similar component values of an active sensor circuit, comprising:
 (a) providing a tunable RF circuit having at least one adjustable capacitor having a variable capacitance C and at least one adjustable inductor having a variable inductance L coupled and configured to filter an applied input signal, the tunable RF circuit having a passband proportional to $1/\sqrt{LC}$ based on selected values of L and C;
 (b) configuring the at least one adjustable capacitor and the at least one adjustable inductor of the tunable RF circuit to receive a tuning signal and use the tuning signal to select the respective values for L and C;
 (c) providing an active sensor circuit comprising:
  (1) at least one adjustable reference capacitor configured to be similar to the at least one adjustable capacitor of the tunable RF circuit and having a variable capacitance C;
  (2) at least one adjustable reference inductor configured to be similar to the at least one adjustable inductor of the tunable RF circuit and having a variable inductance L; and
  (3) a current source coupled to the at least one adjustable reference capacitor and to the at least one adjustable reference inductor;
 (d) configuring the current source, the at least one adjustable reference capacitor, and the at least one adjustable reference inductor of the active sensor circuit so as to provide a high frequency sensor output signal proportional to $1/\sqrt{LC}$ based on the selected respective values of L and C for the at least one adjustable reference capacitor and the at least one adjustable reference inductor;
 (e) configuring the at least one adjustable reference capacitor and the at least one adjustable reference inductor of the active sensor circuit to receive the tuning signal and use the tuning signal to select respective values for L and C;
 (f) providing a control circuit operatively connected to the active sensor circuit and to the tunable RF circuit, including:
  (1) a buffer circuit for receiving the high frequency sensor output signal from the active sensor circuit and outputting a buffered high frequency sensor output signal;
  (2) an integrator, coupled to the buffer circuit, for summing up the buffered high frequency sensor output signal over a period of time and generating an integrator output signal;
  (3) an analog-to-digital converter, coupled to the integrator, for generating a digital signal from the integrator output signal;
  (4) a reference signal generator for generating a reference signal;

(5) a logic circuit, coupled to the reference signal generator and to the analog-to-digital converter, for comparing the digital signal and the reference signal to generate the tuning signal, the tuning signal representing a frequency difference between the reference signal and the digital signal; and (6) a switch for selectably providing the tuning signal to the active sensor circuit until the frequency difference represented by the tuning signal has been minimized by selection of particular respective values of L and C for the at least one adjustable reference capacitor and the at least one adjustable reference inductor, and thereafter providing the tuning signal to the tunable RF circuit to select respective values of L and C for the at least one adjustable capacitor and the at least one adjustable inductor of the tunable RF circuit that essentially match the particular respective values of L and C for the at least one adjustable reference capacitor and the at least one adjustable reference inductor.

8. The method according to claim 6 or claim 7, wherein the reference signal generator includes a crystal oscillator.

9. The method according to claim 6 or claim 7, wherein at least one adjustable inductor and at least one adjustable reference inductor is a digitally tunable inductor (DTL).

10. The method according to claim 6 or claim 7, wherein at least one adjustable capacitor and at least one adjustable reference capacitor is a digitally tunable capacitor (DTC).

11. A system for tuning component values of a tunable radio frequency (RF) circuit based on similar component values of an active sensor circuit, comprising:
(a) a tunable RF LC circuit coupled and configured to modify an applied RF input signal, the tunable RF LC circuit having L and C components and a passband proportional to $1/\sqrt{LC}$ wherein the tunable RF LC circuit is configured to receive a tuning signal and use the tuning signal to select respective values for at least one of the L or C components of the tunable RF LC circuit;
(b) an active sensor circuit comprising:
(1) a tunable reference LC circuit having L and C components and configured to be similar to the tunable RF LC circuit; and
(2) a current source coupled to the tunable reference LC circuit;
wherein the active sensor circuit is configured to receive the tuning signal and use the tuning signal to select respective values for at least one of the L or C components of the tunable reference LC circuit, and wherein the current source and the tunable reference LC circuit are configured so as to provide a high frequency sensor output signal proportional to $1/\sqrt{LC}$ based on the selected respective values of L and/or C for the tunable reference LC circuit;
(c) a divider control circuit operatively connected to the active sensor circuit and to the tunable RF LC circuit, for receiving the high frequency sensor output signal from the active sensor circuit, dividing the high frequency sensor output signal to a reduced frequency low enough to enable further utilization within the divider control circuit, comparing the divided high frequency sensor output signal to a reference signal, and generating the tuning signal, the tuning signal representing a frequency difference between the reference signal and the divided high frequency sensor output signal; and
(d) a switch, coupled to the divider control circuit, for selectably providing the tuning signal to the active sensor circuit until the frequency difference represented by the tuning signal has been minimized by selection of particular respective values of L and/or C for the tunable reference LC circuit, and thereafter providing the tuning signal to the tunable RF LC circuit to select essentially matching respective values of L and/or C for the tunable RF LC circuit.

12. A system for tuning component values of a tunable radio frequency (RF) circuit based on similar component values of an active sensor circuit, comprising:
(a) a tunable RF LC circuit coupled and configured to filter an applied RF input signal, the tunable RF LC circuit having L and C components and a passband proportional to $1/\sqrt{LC}$ wherein the tunable RF LC circuit is configured to receive a tuning signal and use the tuning signal to select respective values for at least one of the L or C components of the tunable RF LC circuit;
(b) an active sensor circuit comprising:
(1) a tunable reference LC circuit having L and C components and configured to be similar to the tunable RF LC circuit; and
(2) a current source coupled to the tunable reference LC circuit;
wherein the active sensor circuit is configured to receive the tuning signal and use the tuning signal to select respective values for at least one of the L or C components of the tunable reference LC circuit, and wherein the current source and the tunable reference LC circuit are configured so as to provide a high frequency sensor output signal proportional to $1/\sqrt{LC}$ based on the selected respective values of L and/or C for the tunable reference LC circuit; and
(c) a control circuit operatively connected to the active sensor circuit and to the tunable RF LC circuit, including:
(1) an RF divider circuit operatively coupled to the active sensor circuit, for receiving the high frequency sensor output signal from the active sensor circuit and generating a divided-down output signal from the high frequency sensor output signal, the divided-down output signal having a reduced frequency low enough to enable further utilization within the control circuit;
(2) a reference signal generator for generating a reference signal;
(3) a frequency counter, coupled to the reference signal generator and to the RF divider circuit, for generating the tuning signal, the tuning signal representing a frequency difference between the reference signal and the divided-down output signal; and
(4) a switch for selectably providing the tuning signal to the active sensor circuit until the frequency difference represented by the tuning signal has been minimized by selection of particular respective values of L and/or C for the tunable reference LC circuit, and thereafter providing the tuning signal to the tunable RF LC circuit to select essentially matching respective values of L and/or C for the tunable RF LC circuit.

13. A system for tuning component values of a tunable radio frequency (RF) circuit based on similar component values of an active sensor circuit, comprising:
(a) a tunable RF circuit having at least one capacitor having a capacitance C and at least one inductor having an inductance L, wherein at least one of the at least one capacitor and the at least one inductor is adjustable, the tunable RF circuit being coupled and configured to filter an applied RF input signal, the tunable RF circuit having a passband proportional to $1/\sqrt{LC}$ based on selected values of L and C wherein the tunable RF circuit is configured to receive a tuning signal and use the tuning signal to select respective values for L and/or C for the adjustable ones of the at least one capacitor and the at lease one inductor;
(b) an active sensor circuit comprising:
  (1) at least one reference capacitor configured to be similar to the at least one capacitor of the tunable RF circuit and having a capacitance C;
  (2) at least one reference inductor configured to be similar to the at least one inductor of the tunable RF circuit and having an inductance L; and
  (3) a current source coupled to the at least one reference capacitor and to the at least one reference inductor;
  wherein at least one of the at least one reference capacitor and the at least one reference inductor is adjustable, and wherein the active sensor circuit is configured to receive the tuning signal and use the tuning signal to select respective values for L and/or C for the adjustable ones of the at least one reference capacitor and the at least one reference inductor, and wherein the current source, the at least one reference capacitor, and the at least one reference inductor are configured so as to provide a high frequency sensor output signal proportional to $1/\sqrt{LC}$ based on the selected respective values of L and/or C for the adjustable ones of the at least one reference capacitor and the at least one reference inductor; and
(c) a control circuit operatively connected to the active sensor circuit and to the tunable RF circuit, including:
  (1) a buffer circuit for receiving the high frequency sensor output signal from the active sensor circuit and outputting a buffered high frequency sensor output signal;
  (2) an RF divider circuit, coupled to the buffer circuit, for generating a divided-down output signal from the buffered high frequency sensor output signal, the divided-down output signal having a reduced frequency low enough to enable further utilization within the control circuit;
  (3) a reference signal generator for generating a reference signal;
  (4) a frequency counter, coupled to the reference signal generator and to the RF divider circuit, for generating the tuning signal, the tuning signal representing a frequency difference between the reference signal and the divided-down output signal; and
  (5) a switch for selectably providing the tuning signal to the active sensor circuit until the frequency difference represented by the tuning signal has been minimized by selection of particular respective values of L and/or C for the adjustable ones of the at least one reference capacitor and the at least one reference inductor, and thereafter providing the tuning signal to the tunable RF circuit to select respective values of L and/or C for the adjustable ones of the at least one capacitor and the at least one inductor of the tunable RF circuit that essentially match the particular respective values of L and/or C for the at least one reference capacitor and the at least one reference inductor.

14. A system for tuning component values of a tunable radio frequency (RF) circuit based on similar component values of an active sensor circuit, comprising:
(a) a tunable RF LC circuit coupled and configured to modify an applied RF input signal, the tunable RF LC circuit having L and C components and a passband proportional to $1/\sqrt{LC}$ wherein the tunable RF LC circuit is configured to receive a tuning signal and use the tuning signal to select respective values for at least one of the L or C components of the tunable RF LC circuit;
(b) an active sensor circuit comprising:
  (1) a tunable reference LC circuit having L and C components and configured to be similar to the tunable RF LC circuit; and
  (2) a current source coupled to the tunable reference LC circuit;
  wherein the active sensor circuit is configured to receive the tuning signal and use the tuning signal to select respective values for at least one of the L or C components of the tunable reference LC circuit, and wherein the current source and the tunable reference LC circuit are configured so as to provide a high frequency sensor output signal proportional to $1/\sqrt{LC}$ based on the selected respective values of L and/or C for the tunable reference LC circuit;
(c) an integrator control circuit operatively connected to the active sensor circuit and to the tunable RF LC circuit, for receiving the high frequency sensor output signal from the active sensor circuit, summing up the high frequency sensor output signal over a period of time, and generating a digital integrator output signal;
(d) a logic circuit, coupled to the integrator control circuit, for comparing the digital integrator output signal to a reference signal to generate the tuning signal, the tuning signal representing a frequency difference between the reference signal and the digital integrator output signal; and
(e) a switch, coupled to the integrator control circuit, for selectably providing the tuning signal to the active sensor circuit until the frequency difference represented by the tuning signal has been minimized by selection of particular respective values of L and/or C for the tunable reference LC circuit, and thereafter providing the tuning signal to the tunable RF LC circuit to select essentially matching respective values of L and/or C for the tunable RF LC circuit.

15. A system for tuning component values of a tunable radio frequency (RF) circuit based on similar component values of an active sensor circuit, comprising:
(a) a tunable RF LC circuit coupled and configured to filter an applied RF input signal, the tunable RF LC circuit having L and C components and a passband proportional to $1/\sqrt{LC}$ wherein the tunable RF LC circuit is configured to receive a tuning signal and use the tuning signal to select respective values for at least one of the L or C components of the tunable RF LC circuit;
(b) an active sensor circuit comprising:
  (1) a tunable reference LC circuit having L and C components and configured to be similar to the tunable RF LC circuit; and
  (2) a current source coupled to the tunable reference LC circuit;
  wherein the active sensor circuit is configured to receive the tuning signal and use the tuning signal to select respective values for at least one of the L or C components of the tunable reference LC circuit, and wherein the current source and the tunable reference LC circuit are configured so as to provide a high frequency sensor output signal proportional to $1/\sqrt{LC}$ based on the selected respective values of L and/or C for the tunable reference LC circuit; and
(c) a control circuit operatively connected to the active sensor circuit and to the tunable RF LC circuit, including:

(1) an integrator, operatively coupled to the active sensor circuit, for receiving the high frequency sensor output signal from the active sensor circuit and summing up the high frequency sensor output signal over a period of time and generating an integrator output signal;
(2) an analog-to-digital converter, coupled to the integrator, for generating a digital signal from the integrator output signal;
(3) a reference signal generator for generating a reference signal;
(4) a logic circuit, coupled to the reference signal generator and to the analog-to-digital converter, for comparing the digital signal and the reference signal to generate the tuning signal, the tuning signal representing a frequency difference between the reference signal and the digital signal; and
(5) a switch for selectably providing the tuning signal to the active sensor circuit until the frequency difference represented by the tuning signal has been minimized by selection of particular respective values of L and/or C for the tunable reference LC circuit, and thereafter providing the tuning signal to the tunable RF LC circuit to select essentially matching respective values of L and/or C for the tunable RF LC circuit.

16. A system for tuning component values of a tunable radio frequency (RF) circuit based on similar component values of an active sensor circuit, comprising:
(a) a tunable RF circuit having at least one capacitor having a capacitance C and at least one inductor having an inductance L, wherein at least one of the at least one capacitor and the at least one inductor is adjustable, the tunable RF circuit being coupled and configured to filter an applied RF input signal, the tunable RF circuit having a passband proportional to $1/\sqrt{LC}$ based on selected values of L and C wherein the tunable RF circuit is configured to receive a tuning signal and use the tuning signal to select respective values for L and/or C for the adjustable ones of the at least one capacitor and the at least one inductor;
(b) an active sensor circuit comprising:
(1) at least one reference capacitor configured to be similar to the at least one capacitor of the tunable RF circuit and having a capacitance C;
(2) at least one reference inductor configured to be similar to the at least one inductor of the tunable RF circuit and having an inductance L; and
(3) a current source coupled to the at least one reference capacitor and to the at least one reference inductor;
wherein at least one of the at least one reference capacitor and the at least one reference inductor is adjustable, and wherein the active sensor circuit is configured to receive the tuning signal and use the tuning signal to select respective values for L and/or C for the adjustable ones of the at least one reference capacitor and the at least one reference inductor, and wherein the current source, the at least one reference capacitor, and the at least one reference inductor are configured so as to provide a high frequency sensor output signal proportional to $1/\sqrt{LC}$ based on the selected respective values of L and/or C for the adjustable ones of the at least one reference capacitor and the at least one reference inductor; and
(c) a control circuit operatively connected to the active sensor circuit and to the tunable RF circuit, including:

(1) a buffer circuit for receiving the high frequency sensor output signal from the active sensor circuit and outputting a buffered high frequency sensor output signal;
(2) an integrator, coupled to the buffer circuit, for summing up the buffered high frequency sensor output signal over a period of time and generating an integrator output signal;
(3) an analog-to-digital converter, coupled to the integrator, for generating a digital signal from the integrator output signal;
(4) a reference signal generator for generating a reference signal;
(5) a logic circuit, coupled to the reference signal generator and to the analog-to-digital converter, for comparing the digital signal and the reference signal to generate the tuning signal, the tuning signal representing a frequency difference between the reference signal and the digital signal; and
(6) a switch for selectably providing the tuning signal to the active sensor circuit until the frequency difference represented by the tuning signal has been minimized by selection of particular respective values of L and/or C for the adjustable ones of the at least one reference capacitor and the at least one reference inductor, and thereafter providing the tuning signal to the tunable RF circuit to select respective values of L and/or C for the adjustable ones of the at least one capacitor and the at least one inductor of the tunable RF circuit that essentially match the particular respective values of L and/or C for the at least one reference capacitor and the at least one reference inductor.

17. A method for tuning component values of a tunable radio frequency (RF) circuit based on similar component values of an active sensor circuit, comprising:
(a) providing a tunable RF LC circuit coupled and configured to modify an applied RF input signal, the tunable RF LC circuit having L and C components and a passband proportional to $1/\sqrt{LC}$ ;
(b) configuring the tunable RF LC circuit to receive a tuning signal and use the tuning signal to select respective values for at least one of the L or C components of the tunable RF LC circuit;
(c) providing an active sensor circuit comprising:
(1) a tunable reference LC circuit having L and C components and configured to be similar to the tunable RF LC circuit; and
(2) a current source coupled to the tunable reference LC circuit;
(d) configuring the active sensor circuit to receive the tuning signal and use the tuning signal to select respective values for at least one of the L or C components of the tunable reference LC circuit;
(e) configuring the current source and the tunable reference LC circuit so as to provide a high frequency sensor output signal proportional to $1/\sqrt{LC}$ based on the selected respective values of L and/or C for the tunable reference LC circuit;
(f) receiving the high frequency sensor output signal from the active sensor circuit, dividing the high frequency sensor output signal to a reduced frequency, comparing the divided high frequency sensor output signal to a reference signal, and generating the tuning signal, the tuning signal representing a frequency difference between the reference signal and the divided high frequency sensor output signal; and (g) selectively providing the tuning signal to the active sensor circuit until the frequency difference represented by the tuning signal has been minimized by selection of particular respective values of L and/or C for the tunable reference LC circuit, and thereafter providing the tuning signal to the tunable RF LC circuit to select essentially matching respective values of L and/or C for the tunable RF LC circuit.

18. A method for tuning component values of a tunable radio frequency (RF) circuit based on similar component values of an active sensor circuit, comprising:
  (a) providing a tunable RF LC circuit coupled and configured to filter an applied RF input signal, the tunable RF LC circuit having L and C components and a passband proportional to $1/\sqrt{LC}$;
  (b) configuring the tunable RF LC circuit to receive a tuning signal and use the tuning signal to select respective values for at least one of the L or C components of the tunable RF LC circuit;
  (c) providing an active sensor circuit comprising:
    (1) a tunable reference LC circuit having L and C components and configured to be similar to the tunable RF LC circuit; and
    (2) a current source coupled to the tunable reference LC circuit;
  (d) configuring the active sensor circuit to receive the tuning signal and use the tuning signal to select respective values for at least one of the L or C components of the tunable reference LC circuit;
  (e) configuring the current source and the tunable reference LC circuit so as to provide a high frequency sensor output signal proportional to $1/\sqrt{LC}$ based on the selected respective values of L and/or C for the tunable reference LC circuit;
  (f) providing a control circuit operatively connected to the active sensor circuit and to the tunable RF LC circuit for generating the tuning signal, including:
    (1) an RF divider circuit operatively coupled to the active sensor circuit, for receiving the high frequency sensor output signal from the active sensor circuit and generating a divided-down output signal from the high frequency sensor output signal, the divided-down output signal having a reduced frequency low enough to enable further utilization within the control circuit;
    (2) a reference signal generator for generating a reference signal; and
    (3) a frequency counter, coupled to the reference signal generator and to the RF divider circuit, for generating the tuning signal, the tuning signal representing a frequency difference between the reference signal and the divided-down output signal; and
  (g) selectably providing the tuning signal to the active sensor circuit until the frequency difference represented by the tuning signal has been minimized by selection of particular respective values of L and/or C for the tunable reference LC circuit, and thereafter providing the tuning signal to the tunable RF LC circuit to select essentially matching respective values of L and/or C for the tunable RF LC circuit.

19. A method for tuning component values of a tunable radio frequency (RF) circuit based on similar component values of an active sensor circuit, comprising:
  (a) providing a tunable RF circuit having at least one capacitor having a capacitance C and at least one inductor having an inductance L, wherein at least one of the at least one capacitor and the at least one inductor is adjustable, the tunable RF circuit being coupled and configured to filter an applied RF input signal, the tunable RF circuit having a passband proportional to $1/\sqrt{LC}$ based on selected values of L and C;
  (b) configuring the tunable RF circuit to receive a tuning signal and use the tuning signal to select respective values for L and/or C for the adjustable ones of the at least one capacitor and the at least one inductor;
  (c) configuring an active sensor circuit comprising:
    (1) at least one reference capacitor configured to be similar to the at least one capacitor of the tunable RF circuit and having a capacitance C;
    (2) at least one reference inductor configured to be similar to the at least one inductor of the tunable RF circuit and having an inductance L; and
    (3) a current source coupled to the at least one reference capacitor and to the at least one reference inductor;
    wherein at least one of the at least one reference capacitor and the at least one reference inductor is adjustable;
  (d) configuring the active sensor circuit to receive the tuning signal and use the tuning signal to select respective values for L and/or C for the adjustable ones of the at least one reference capacitor and the at least one reference inductor;
  (e) configuring the current source, the at least one reference capacitor, and the at least one reference inductor so as to provide a high frequency sensor output signal proportional to $1/\sqrt{LC}$, based on the selected respective values of L and/or C for the adjustable ones of the at least one reference capacitor and the at least one reference inductor;
  (f) providing a control circuit operatively connected to the active sensor circuit and to the tunable RF circuit for generating the tuning signal, including:
    (1) a buffer circuit for receiving the high frequency sensor output signal from the active sensor circuit and outputting a buffered high frequency sensor output signal;
    (2) an RF divider circuit, coupled to the buffer circuit, for generating a divided-down output signal from the buffered high frequency sensor output signal, the divided-down output signal having a reduced frequency low enough to enable further utilization within the control circuit;
    (3) a reference signal generator for generating a reference signal; and
    (4) a frequency counter, coupled to the reference signal generator and to the RF divider circuit, for generating the tuning signal, the tuning signal representing a frequency difference between the reference signal and the divided-down output signal; and
  (g) selectably providing the tuning signal to the active sensor circuit until the frequency difference represented by the tuning signal has been minimized by selection of particular respective values of L and/or C for the adjustable ones of the at least one reference capacitor and the at least one reference inductor, and thereafter providing the tuning signal to the tunable RF circuit to select respective values of L and/or C for the adjustable ones of the at least one capacitor and the at least one inductor of the tunable RF circuit that essentially match the particular respective values of L and/or C for the at least one reference capacitor and the at least one reference inductor.

20. A method for tuning component values of a tunable radio frequency (RF) circuit based on similar component values of an active sensor circuit, comprising:
(a) providing a tunable RF LC circuit coupled and configured to filter an applied RF input signal, the tunable RF LC circuit having L and C components and a passband proportional to $1/\sqrt{LC}$;
(b) configuring the tunable RF LC circuit to receive a tuning signal and use the tuning signal to select respective values for at least one of the L or C components of the tunable RF LC circuit;
(c) providing an active sensor circuit comprising:
(1) a tunable reference LC circuit having L and C components and configured to be similar to the tunable RF LC circuit; and
(2) a current source coupled to the tunable reference LC circuit;
(d) configuring the active sensor circuit to receive the tuning signal and use the tuning signal to select respective values for at least one of the L or C components of the tunable reference LC circuit;
(e) configuring the current source and the tunable reference LC circuit so as to provide a high frequency sensor output signal proportional to $1/\sqrt{LC}$ based on the selected respective values of L and/or C for the tunable reference LC circuit;
(f) receiving the high frequency sensor output signal from the active sensor circuit, summing up the high frequency sensor output signal over a period of time, generating a digital integrator output signal, and comparing the digital integrator output signal to a reference signal to generate the tuning signal, the tuning signal representing a frequency difference between the reference signal and the digital integrator output signal; and
(g) selectably providing the tuning signal to the active sensor circuit until the frequency difference represented by the tuning signal has been minimized by selection of particular respective values of L and/or C for the tunable reference LC circuit, and thereafter providing the tuning signal to the tunable RF LC circuit to select essentially matching respective values of L and/or C for the tunable RF LC circuit.

21. A method for tuning component values of a tunable radio frequency (RF) circuit based on similar component values of an active sensor circuit, comprising:
(a) configuring a tunable RF LC circuit coupled and configured to filter an applied RF input signal, the tunable RF LC circuit having L and C components and a passband proportional to $1/\sqrt{LC}$;
(b) configuring the tunable RF LC circuit to receive a tuning signal and use the tuning signal to select respective values for at least one of the L or C components of the tunable RF LC circuit;
(c) providing an active sensor circuit comprising:
(1) a tunable reference LC circuit having L and C components and configured to be similar to the tunable RF LC circuit; and
(2) a current source coupled to the tunable reference LC circuit;
(d) configuring the active sensor circuit to receive the tuning signal and use the tuning signal to select respective values for at least one of the L or C components of the tunable reference LC circuit;
(e) configuring the current source and the tunable reference LC circuit so as to provide a high frequency sensor output signal proportional to $1/\sqrt{LC}$ based on the selected respective values of L and/or C for the tunable reference LC circuit; and
(f) providing a control circuit operatively connected to the active sensor circuit and to the tunable RF LC circuit, including:
(1) an integrator, operatively coupled to the active sensor circuit, for receiving the high frequency sensor output signal from the active sensor circuit and summing up the high frequency sensor output signal over a period of time and generating an integrator output signal;
(2) an analog-to-digital converter, coupled to the integrator, for generating a digital signal from the integrator output signal;
(3) a reference signal generator for generating a reference signal; and
(4) a logic circuit, coupled to the reference signal generator and to the analog-to-digital converter, for comparing the digital signal and the reference signal to generate the tuning signal, the tuning signal representing a frequency difference between the reference signal and the digital signal; and
(g) selectably providing the tuning signal to the active sensor circuit until the frequency difference represented by the tuning signal has been minimized by selection of particular respective values of L and/or C for the tunable reference LC circuit, and thereafter providing the tuning signal to the tunable RF LC circuit to select essentially matching respective values of L and/or C for the tunable RF LC circuit.

22. The invention according to claims 11, 12, 14, 15, 17, 18, 20, or 21, wherein the tunable RF LC circuit and the tunable reference LC circuit each include at least one of a digitally tunable inductor (DTL) or a digitally tunable capacitor (DTC).

23. A method for tuning component values of a tunable radio frequency (RF) circuit based on similar component values of an active sensor circuit, comprising:
(a) configuring a tunable RF circuit having at least one capacitor having a capacitance C and at least one inductor having an inductance L, wherein at least one of the at least one capacitor and the at least one inductor is adjustable, the tunable RF circuit being coupled and configured to filter an applied RF input signal, the tunable RF circuit having a passband proportional to $1/\sqrt{LC}$ based on selected values of L and C;
(b) configuring the tunable RF circuit to receive a tuning signal and use the tuning signal to select respective values for L and/or C for the adjustable ones of the at least one capacitor and the at least one inductor;
(c) providing an active sensor circuit comprising:
(1) at least one reference capacitor configured to be similar to the at least one capacitor of the tunable RF circuit and having a capacitance C;
(2) at least one reference inductor configured to be similar to the at least one inductor of the tunable RF circuit and having an inductance L; and
(3) a current source coupled to the at least one reference capacitor and to the at least one reference inductor;
wherein at least one of the at least one reference capacitor and the at least one reference inductor is adjustable;
(d) configuring the active sensor circuit to receive the tuning signal and use the tuning signal to select respective values for L and/or C for the adjustable ones of the at least one reference capacitor and the at least one reference inductor;

(e) configuring the current source, the at least one reference capacitor, and the at least one reference inductor so as to provide a high frequency sensor output signal proportional to $1/\sqrt{LC}$ based on the selected respective values of L and/or C for the adjustable ones of the at least one reference capacitor and the at least one reference inductor; and (f) providing a control circuit operatively connected to the active sensor circuit and to the tunable RF circuit, including:
  (1) a buffer circuit for receiving the high frequency sensor output signal from the active sensor circuit and outputting a buffered high frequency sensor output signal;
  (2) an integrator, coupled to the buffer circuit, for summing up the buffered high frequency sensor output signal over a period of time and generating an integrator output signal;
  (3) an analog-to-digital converter, coupled to the integrator, for generating a digital signal from the integrator output signal;
  (4) a reference signal generator for generating a reference signal; and
  (5) a logic circuit, coupled to the reference signal generator and to the analog-to-digital converter, for comparing the digital signal and the reference signal to generate the tuning signal, the tuning signal representing a frequency difference between the reference signal and the digital signal; and (g) selectably providing the tuning signal to the active sensor circuit until the frequency difference represented by the tuning signal has been minimized by selection of particular respective values of L and/or C for the adjustable ones of the at least one reference capacitor and the at least one reference inductor, and thereafter providing the tuning signal to the tunable RF circuit to select respective values of L and/or C for the adjustable ones of the at least one capacitor and the at least one inductor of the tunable RF circuit that essentially match the particular respective values of L and/or C for the at least one reference capacitor and the at least one reference inductor.

24. The invention according to claims 13, 16, 19, or 23, wherein at least one adjustable inductor and at least one adjustable reference inductor is a digitally tunable inductor (DTL).

25. The invention according to claims 13, 16, 19, or 23, wherein at least one adjustable inductor and at least one adjustable reference inductor is a digitally tunable capacitor (DTC).

* * * * *